(12) United States Patent
Hsu et al.

(10) Patent No.: US 6,714,457 B1
(45) Date of Patent: Mar. 30, 2004

(54) PARALLEL CHANNEL PROGRAMMING SCHEME FOR MLC FLASH MEMORY

(75) Inventors: Fu-Chang Hsu, San Jose, CA (US); Peter W. Lee, Saratoga, CA (US); Hsing-Ya Tsao, San Jose, CA (US)

(73) Assignee: Aplus Flash Technology, Inc., San Jose, CA (US)

( * ) Notice: Subject to any disclaimer, the term of this patent is extended or adjusted under 35 U.S.C. 154(b) by 0 days.

(21) Appl. No.: 10/233,642

(22) Filed: Sep. 3, 2002

Related U.S. Application Data

(60) Provisional application No. 60/323,245, filed on Sep. 19, 2001.

(51) Int. Cl.[7] .............................................. G11C 16/04
(52) U.S. Cl. .............................. 365/185.28; 365/185.03
(58) Field of Search ....................... 365/185.03, 185.17, 365/185.22, 185.28

(56) References Cited

U.S. PATENT DOCUMENTS 5,748,538 A    5/1998   Lee et al. .............. 365/185.06
5,768,188 A    6/1998   Park et al. ............. 365/185.03
5,995,412 A  * 11/1999   Ohta ..................... 365/185.03

OTHER PUBLICATIONS

"A 98 mm$^2$ 3.3V 64MB Flash Memory with FN–NOR Type 4–level Cell," Ohkawa et al., Isscc, 1996, Session 2, TP 2.3, pp. 36–37.

* cited by examiner

*Primary Examiner*—Son Mai
(74) *Attorney, Agent, or Firm*—George O. Saile; Stephen B. Ackerman

(57) ABSTRACT

In the present invention programming a plurality of MLC flash memory cells is done in parallel using a channel programming operation by applying a high positive voltage to a word line and positive voltages to the bit lines connected to cells to be programmed. The positive bit line voltages combined with the word line voltage create a channel voltage that is sufficient to program a required Vt level into each cell in parallel during a predetermined amount of time. Using a high positive word line voltage turns on the channel of a cell being programmed and eliminates potential breakdown condition, band to band tunneling current, channel pinch through and hole injection into the gate insulator, while allowing a small symmetrical cell that has low power consumption and a higher endurance cycle.

36 Claims, 12 Drawing Sheets

| Target Vt = | 0.5V | 1.5V | 2.5V | 3.5V |
| --- | --- | --- | --- | --- |
| $V_{WL}$ | $V_{BL00}=$ $V_{SL00}$ | $V_{BL01}=$ $V_{SL01}$ | $V_{BL10}=$ $V_{SL10}$ | $V_{BL11}=$ $V_{SL11}$ |
| Step 1 +11V | 0V | 0V | 0V | 0V |
| Step 2 +13V | 6V | 0V | 0V | 0V |
| Step 3 +15V | 6V | 6V | 0V | 0V |
| Step 4 +17V | 6V | 6V | 6V | 0V |

|  | Soft Programming | | | | Programming | | | |
| --- | --- | --- | --- | --- | --- | --- | --- | --- |
|  | t1 | t2 | t3 | t4 | t5 | t6 | t7 | t8 |
| $V_{WL}$ | 13V | 14V | 15V | 16V | 17V | 17V | 17V | 17V |
| $V_{BL00}$ | 6V | 6V | 6V | 6V | 6V | 6V | 6V | 6V |
| $V_{BL01}$ | 4V | 4V | 4V | 4V | 4V | 4V | 4V | 4V |
| $V_{BL10}$ | 2V | 2V | 2V | 2V | 2V | 2V | 2V | 2V |
| $V_{BL11}$ | 0V | 0V | 0V | 0V | 0V | 0V | 0V | 0V |

FIG. 7A

|  | Soft Programming | | | | Programming | | | |
| --- | --- | --- | --- | --- | --- | --- | --- | --- |
|  | t1 | t2 | t3 | t4 | t5 | t6 | t7 | t8 |
| $V_{WL}$ | 13V | 14V | 15V | 16V | 17V | 17V | 17V | 17V |
| $V_{BL00}$ | 3.5V | 4.5V | 5V | 5.5V | 6V | 6V | 6V | 6V |
| $V_{BL01}$ | 2V | 2.5V | 3V | 3.5V | 4V | 4V | 4V | 4V |
| $V_{BL10}$ | 0V | 0.5V | 1V | 1.5V | 2V | 2V | 2V | 2V |
| $V_{BL11}$ | 0V | 0V | 0V | 0V | 0V | 0V | 0V | 0V |

FIG. 7B

MLC Program Verify (Data=10)

Dump Data (Data=1;0)

PARALLEL CHANNEL PROGRAMMING SCHEME FOR MLC FLASH MEMORY

The instant application claims priority to U.S. Provisional Application Ser. No. 60/323,245 filed Sep. 19, 2001, which is herein incorporated by reference.

BACKGROUND OF THE INVENTION

1. Field of the Invention

The present invention relates to semiconductor flash memory, and more particularly to programming multiple level cell (MLC) flash memory, including NAND and NOR type arrays.

2. Description of the Related Art

Flash memory is widely used in today's electronic products especially for portable applications as a result of its non-volatility and in system re-programmability. The basic structure of a flash memory cell contains a control gate, a drain diffusion region and a source diffusion region on the substrate to form a transistor with a floating gate under the control gate to be the electron storage device. The channel region lies under the floating gate with a tunnel oxide layer between the channel and floating gate that is the insulation layer. The energy barrier of the tunnel oxide can be overcome by applying a sufficiently high electric field across the tunnel oxide. This allows electrons to pass through the tunnel oxide, which is used to change the number of electrons stored in the floating gate. The number of electrons stored in the floating gate determines the threshold voltage (Vt) of the cell. More electrons stored in the floating gate causes the cell to have a higher Vt. The Vt of a cell is used to represent the stored data of the cell.

To change the Vt of a cell to a higher or lower value, the number of the electrons stored in the floating gate is increased or decreased by applying proper voltages to the control gate, the drain and source regions, and the channel region to cause electrons to move between one or more of these nodes and through the tunnel oxide layer to the floating gate. When the electrons are moved between the channel region and the floating gate, it is referred to as a channel operation. When the electrons are moved between the drain or source region and the floating gate, it is referred as an edge operation since it takes place on the overlap region between the edge of the floating gate and the drain or source region.

When changing the Vt of a flash memory cell, two operations are required. The first operation, called an erase operation, is applied to a large number of cells called a block. The second operation, called a program operation, is applied to a smaller number of cells called a page. The erase operation will change the Vt of all the cells in a selected block to a high Vt or a low Vt, depending on the design consideration. The program operation will change the Vt of selected cells to a value opposite that of the erase operation. While the erase operation is performed on a collective basis, the program operation must be bit selectable in order to change the Vt of a individual cell according to the desired data. There are various mechanisms and technologies suitable for erasing and programming different types of flash memories including the Fowler-Nordheim (F-N) tunneling mechanism, which is chosen because of its extremely low power consumption.

In U.S. Pat. No. 5,748,538 (Lee et al.) a flash memory cell array is directed to the use of Fowler-Nordheim tunneling for programming the cells. The memory cell stores two levels of threshold voltage (Vt). Both over erase and over programming repair capability is discussed. U.S. Pat. No. 5,768,188 (Park et al.) is directed to a multi-level flash memory cell (MLC) array using a conventional MLC programming scheme that uses a serial stepwise word line voltage to control the programming time as well as the Vt distribution of MLC.

A flash memory, which stores two levels of Vt in a cell, is called a single bit cell. For example, assume the low Vt level of a cell is below +2V and the high Vt level is above +4V. During a read operation, a voltage between the two Vt levels, e.g. +3V, is applied to the selected word line and in turn to the control gate of the selected cell to check the Vt of the cell. If the cell is in a low Vt state, the voltage applied to the control gate will turn on the channel of the selected cell and allow current to flow through the channel from the drain to the source. If the cell is in a high Vt state, the voltage applied to the control gate will not be able to turn on the channel of the cell, thus preventing current flowing from drain to source. With the source region grounded, the selected bit line and the drain region of the selected cell is biased at around +1V. A sense amplifier is used to detect the current flowing on the bit line and converts the amount of current flow into logical "0" or logical "1" data.

A Multiple Level Cell (MLC) technology has attracted a lot of attention due to its cost efficiency. By storing $2^N$ discrete levels of Vt, the MLC can store N bits of data per cell, thus reducing the equivalent cell size to 1/N. Because of the multiple bits of data per cell, the MLC has become one of the best candidates in mass storage applications that typically require high density such as 512 Mb and beyond. FIG. 1 shows an example of typical Vt distribution of 4-level MLC. The Vt of the cell is divided into four levels to represent data (00), (01), (10) and (11). When read, three reference voltages Vref1, Vref2 and Vref3 are applied to check the Vt level.

The implementation of MLC requires a key design technique, which is how to accurately control the Vt distribution of the programmed cell. Because the Vt distribution for each level and the margin between the levels is much smaller than that of the single bit cell, a highly accurate programming scheme is needed to achieve the tight Vt control. The conventional programming scheme used for single bit cell is not suitable for this purpose. When programming a single bit cell, typically the word line and bit line are coupled to fixed voltages. For example, the word line is coupled to +17V and the bit line is coupled to +0V. This voltage condition will cause the Vt of the programmed cell to increase. The final programmed Vt is controlled by the programming time. However, it is very difficult to achieve the tight Vt distribution requirement of MLC by using this approach.

FIG. 2 shows a typical curve of programmed Vt vs programming time. As the figure shows, the relationship between the programmed Vt and programming time is approximately an exponential curve; a higher Vt requires several orders longer time to program than the lower Vt. For example, programming Vt to +3.5V takes 200 us, the same program condition to program the Vt to +0.5V will take about only 1/1000 of the time, or 200 ns. The extremely short programming time is very difficult to control and can easily end up being over programming. On the other hand, if the word line voltage is reduced to +11V to slow down the programming time for Vt so that +0.5V takes 200 us, the programming time for +3.5V will become as long as 200 ms.

FIG. 3A shows a stepwise word line voltage to control the programming time and Vt distribution of an MLC. FIG. 3B shows the voltage setup for the word line and bit lines. Assuming four cells, M1, M2, M3 and M4 are selectively programmed to a Vt of +0.5V, +1.5V, +2.5V and +3.5V, respectively. The program operation is divided into four sequential steps. In the first step, the word line voltage is coupled to a voltage of +11V, and the bit lines of all the four cells, VBL00, VBL01, VBL10 and VBL11, are coupled to 0V. The voltages of the source lines VSL00, VSL01, VSL10 and VSL11 can be either coupled to the same voltage as the corresponding bit lines or remain floating. Because the word line is coupled with a high voltage during the program operation, the channels of the selected cells will be turned on and pass the bit line voltages to the source lines. The source lines must be coupled to the same voltages as the bit line, or remained floating to prevent current leakage. The bias condition will program the Vt of all the four cells to +0.5V in approximately 200 us.

Continuing to refer to FIGS. 3A and 3B, in the second step, the word line voltage is increased to about +13V to program the Vt of the cells to +1.5V. Since the cell M1 has reached its target Vt=+0.5V, its bit line voltage, $V_{BL00}$, will be coupled to a positive voltage such as +6V to reduce the voltage difference between its word line and bit line to inhibit the cell from being further programmed. For cells M2, M3 and M4, bit lines connected to these cells are coupled to 0V to program the Vt to +1.5V. According to the curve of the programming time vs. Vt shown in FIG. 2, if a fixed word line voltage is applied, it would take about one order of magnitude longer time to program the Vt of the cells to +1.5V than +0.5V. However, because a higher word line voltage is applied, the programming time of this step will be shortened by about one order of magnitude.

Consequently, it will take about the same programming time as the first step, approximately 200 us, to program the Vt of the cells +1.5V. Similarly, the word line voltage is ramped up from +11V, +13V, +15V and +17V in the four steps, to program Vt of the cells to +0.5V, +1.5V, +2.5V and +3.5V, respectively. The bit line voltage for the cell selected to be programmed is coupled to +0V, and the cells not selected to be programmed are coupled with an inhibit bit line voltage of +6V.

FIG. 4 shows the curve of programmed Vt vs. programming time according to the stepwise word line voltage programming scheme of shown in FIGS. 3A and 3B. The proper stepwise word line voltage is selected so that the programming time for each Vt step is similar to that of programming the single bit cell. The curve shows that stepwise word line voltage successfully controls the programming time for each Vt step at approximately 200 us. The overall programming time for the highest Vt level, +3.5V, is about 4 times of that for the lowest Vt level +0.5V. Comparing the stepwise approach with the single bit cell programming as shown in FIG. 2, the programming time for the Vt level +3.5V is about 1000 times longer than that for the Vt level +0.5V. Since the stepwise approach programs the different Vt levels of cells with different word line voltages step by step. This approach is called a "serial programming scheme".

The serial programming scheme has the two significant drawbacks. First, the programming time has to be increased $2^N$ times compared with the single bit cell. Since the programming is performed step by step for each Vt level. For a MLC having $2^N$ Vt levels, it will take $2^N$ times longer than the single bit cell to program, and because programming is typically critical for most of the applications, the longer programming time has become a serious problem for MLC applications. Second, the program disturb time is increased $2^N$ times as compared with the single bit cell. This is because when a Vt level is programmed, all the bit lines of deselected cells have to be coupled with an inhibit voltage, e.g. +6V, to reduce the gate to drain voltage to prevent the cells being programmed. However, this inhibit bit line voltage will be shared by all the cells on a bit line. For the other cells on deselected word lines, the word line voltage is coupled with +0V, thus the bit line voltage will cause the Vt of these cells to decrease over time. This phenomenon is called 'bit line' disturb. This disturb problem becomes extremely important and severe for MLC since the Vt margin between each level is small, e.g. 0.6V, compared with that of a single bit cell, e.g. 3V. Since the programming time is increased by $2^N$ orders of magnitude, the disturb time is also increased by $2^N$ orders of magnitude.

A technical paper "A 98 mm² 3.3V 64 MB Flash Memory with FN-NOR Type 4-level Cell", Ohkawa et al., ISSCC, 1996, Session 2, TP 2.3, pp 36–37 is directed to parallel programming of MLC flash memory cells. During programming a negative high voltage, e.g. −9V, is coupled to a word line and different positive high voltages, e.g. +6V, +5V, +4V and +0V, are coupled to the bit lines to decrease the Vt of the selected cells. Since the voltage of the word line is a high negative value, it will turn off the channel of the cell, and the channel region then will remain at the same voltage as the substrate, typically 0V. The selected bit line is coupled to a positive high voltage, and electrons will be injected from the floating gate to the bit line junction through the edge of the tunnel oxide layer overlapped with the bit line junction. This condition is known as 'edge programming', and it has the following drawbacks. 1) The programmed cell is under a severe breakdown condition. Since the word line is coupled to a high negative voltage, the channel of the selected cell is turned off, which can cause the high positive voltage applied to the bit line junction to breakdown. 2) As a result of the breakdown condition, the bit line diffusion of the memory cell requires a lightly doped deep junction to sustain the higher breakdown voltage, causing the size of the cells to be increased. 3) The programming bias condition causes a band-to-band tunneling (BTBT) current to occur in the drain junction. The tunneling current is several times the programming current, and will leak from the drain junction to the substrate. This will require an increase of the on chip pump supply current. If the pump cannot sustain the BTBT current, the bit line voltage will drop and cause programming failure. 4) The programming bias condition can also produce a punch through condition. The high positive voltage applied to the bit line junction may punch though the channel voltage of the cell gated by the negative word line bias and touch the source junction. To prevent this from happening, the channel length of the cell must be increased, which limits the cell's scalability. 5) The programming bias condition can cause impact ionization to occur in the channel edge near the drain junction. This will generate electron hole pairs, and due to the negative biased gate voltage. The holes will be accelerated and injected into the floating gate. From experimental observation, it has been shown that part of the injected holes can be trapped inside the tunnel oxide and cause an oxide rupture. This phenomenon is known to be the major cause of the degradation of flash memory cell erase and program cycle degradation.

SUMMARY OF THE INVENTION

An objective of the present invention is to parallel program a flash memory using multiple level cells (MLC), where a plurality of cells is programmed at the same time.

Another objective of the present invention is to parallel program a flash memory using MLC, where a plurality of cells of a NOR type or a NAND type cell array are programmed at the same time.

A yet another objective of the present invention is to eliminate the aforementioned problems associated with programming MLC flash memory cells.

Still another objective of the present invention is to parallel program an MLC flash memory using a channel tunneling operation.

Still yet another objective of the present invention is to parallel program an MLC using a fixed high word line voltage and multiple bit line voltages.

A further objective of the present invention is to use a plurality of bit line voltages to program a plurality of Vt levels on a plurality of MLC flash memory cells.

Still a further objective of the present invention is to program all cells on a word line to a plurality of Vt voltages at one time.

Yet a further objective of the present invention is to apply a higher gate to channel voltage to cells requiring a higher Vt.

Yet another objective of the present invention is to select bit line voltages such that the programming speed for the different VT levels are similar.

Yet another objective of the present invention is to accurately control programming time and produce a tight Vt distribution.

Yet still another objective of the present invention is to reduce the overall programming time to $\frac{1}{2}^N$ compared to prior art, where N is the number Vt levels to be programmed.

Yet still another objective of the present invention is to reduce disturb time $\frac{1}{2}^N$ compared to prior art.

Yet still another objective of the present invention is to simplify design of the programming pulse and programming algorithm.

The present invention provides parallel programming of MLC flash memory cells, which are coupled to a common word line with a fixed high positive voltage and by coupling different voltage levels to the bit lines of the flash memory cells. The high word line voltage will turn on the channel of a cell, and the bit line voltage coupled to the drain of cells produces a channel voltage that varies from cell to cell depending upon the value of the bit line voltage. A cell requiring a higher Vt has a higher gate to channel voltage, which shortens the programming time for the higher Vt cell. A cell requiring a lower Vt has a lower gate to channel voltage, which slows the programming time for the low Vt cell. The bit line voltages are so chosen so that all programming time for the lowest Vt cell to the highest Vt cell is accomplished in approximately the same amount of time. This facilitates accurate programming and tight Vt distributions.

BRIEF DESCRIPTION OF THE DRAWINGS

This invention will be described with reference to the accompanying drawings, wherein:

FIGS. 7 and 7B show two examples of soft programming algorithms of the present invention.

DETAILED DESCRIPTION OF THE PREFERRED EMBODIMENT

Figure 5:
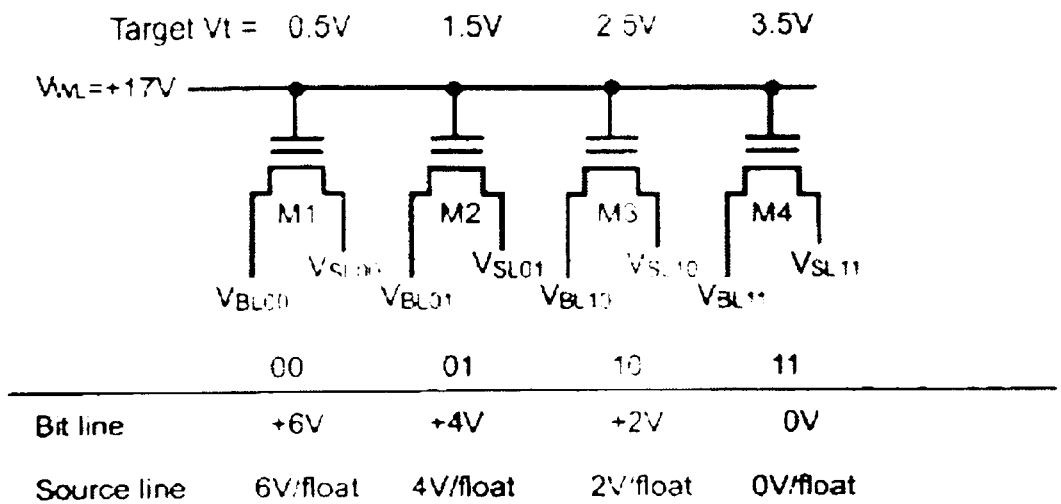
FIG. 5 shows the voltage setup for the word line and bit lines for the present invention.

To overcome the drawbacks of the prior art, the present invention discloses a novel program scheme for MLC called 'parallel programming'. FIG. 5 shows the word line and bit line voltage setup. The parallel programming scheme uses a fixed word line voltage, and different bit line voltages to program the different Vt levels of the cells. Since the different bit line voltages can be applied to different bit lines simultaneously, many cells connected to a word line can be programmed to different Vt levels in parallel, thus shortening the overall programming time significantly. Moreover, because different bit line voltages are used for the programming the different Vt levels, the result will be tight programming time and tight Vt distribution control. For example, to program four cells M1, M2, M3 and M4 on a word line to four different Vt levels of +0.5V, +1.5V, +2.5V and +3.5V, the word line is coupled to a positive high voltage, e.g. +17V, and the bit line voltages for the four cell's, VBL00, VBL01, VBL10 and VBL11, are coupled with four different voltages, e.g. +6V, +4V, +2V and +0V, respectively. The voltages of the source lines, VSL00, VSL01, VSL10 and VSL11 are applied with the same voltages as the corresponding bit lines or remained at floating. The word line high voltage will turn on the channel of the cells and pass the bit line voltage to the channel region, of each cell. This causes the difference between the gate and channel voltage of the four cells, M1, M2, M3 and M4, to be equivalent to +11 V, +13V, +15V and +17V, respectively. Since the cell that needs to be programmed to a higher Vt is applied with a higher gate to channel voltage, the programming time will be shortened for the higher Vt level. The bit line voltages are selected so that the programming speed for the different Vt levels can become similar. Therefore, accurate programming time control and tight Vt distribution can be realized.

It should be noted that although the discussion has been about programming in parallel four cells with four different threshold voltages, a larger number of cells each with different threshold voltages can be programmed in parallel where each successive cell has a bit line voltage which is lower than the previous cell being programmed and a threshold voltage larger than the previous cell being programmed. If there are N memory cells coupled to N bit line voltages, where an N-M+1 bit line voltage is larger than an N-M+2 bit line voltage, and If the word line connecting the N memory cells is coupled to a high voltage, then the N memory cells will be programmed to N threshold voltages, where the threshold voltage of the memory cell couple to the N-M+1 bit line voltage is smaller than the threshold voltage of the memory cell coupled to the N-M+2 bit line voltage.

For an FN (Fowler-Nordheim) channel-program, the program speed means how soon the Vt of a cell can be increased by injecting electrons from p-substrate into the floating gate of selected cells. The speed of movement of electrons into floating gate from substrate is subject to the electric field of tunneling oxide between p-substrate and floating. According to FN-tunneling physics, one volt increase in the tunneling electric field will result in a ten times faster program speed. The effective electric field of tunneling oxide of flash memory cell is determined by two coupling voltages, the control gate (word line) voltage and the channel region (bit line) voltage, and the initial charge of floating gate, e.g., the initial Vt during channel program operation. As long as the effective tunneling electric field is kept the same in all selected cells during MLC programming, the same program speed can be achieved regardless of bit line and word line voltages, and the initial Vt of the floating gate of the flash cells. In the technique of the present invention, all selected cells for MLC programming have similar tunneling electric field thus have similar program speed. The reason of a similar tunneling electric field for different cells is due to different bit line voltage and initial Vt (initial-charge in floating gate) but the same fixed word line voltage. For example, a two-volt Bit line inhibit voltage difference for a one-volt Vt difference between cells with a same word line voltage makes the effective tunneling electric field of all selected cells for MLC programming be the same by simulation. Since the coupling ratios of the cells between word line and bit line varies with difference cell structure and technology, the assigned voltage of a word line and a bit line may have to be adjusted accordingly.

Figure 3A:
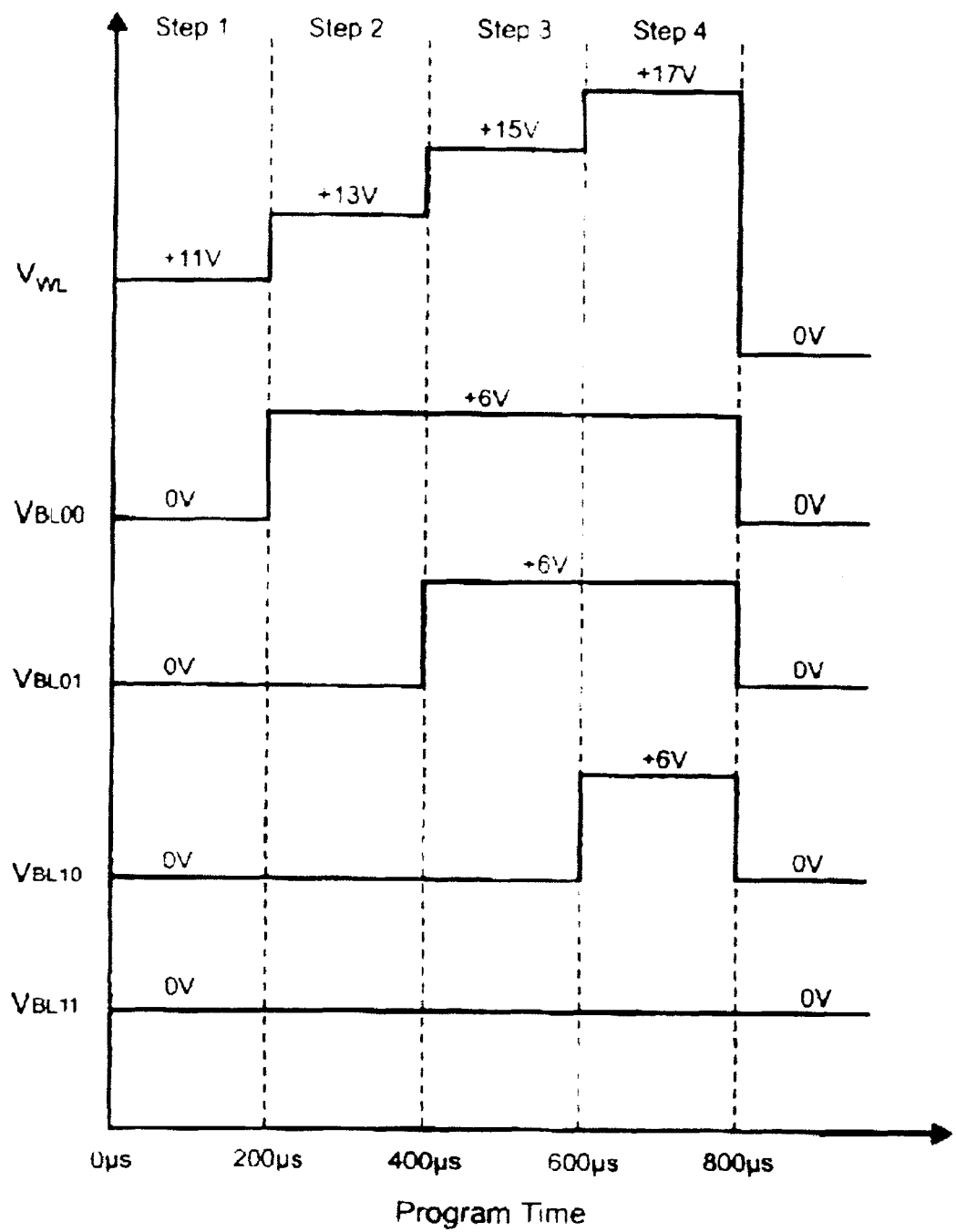
FIG. 3A is a graph showing word line and bit line voltages for a serial programming scheme of prior art.
Figure 3B:
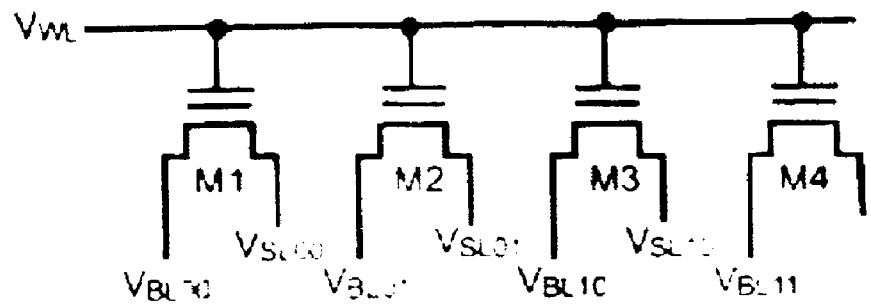
FIG. 3B shows the voltage setup for the word line and bit lines for the serial programming scheme of prior art.
Figure 4:
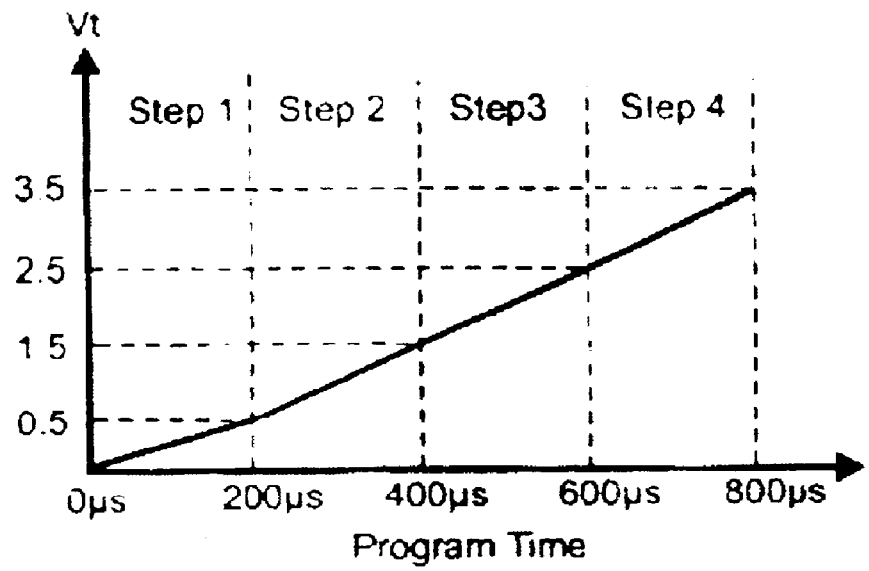
FIG. 4 is a graph showing the programming time for various Vt levels for the serial programming scheme of prior art.

Referring to the word line voltages of the prior art shown in FIGS. 3A and 3B, the channel voltages of the present invention are similar to the channel voltages created by the four stepwise word line voltages applied in the four steps to program the four Vt levels as shown in the prior art. However, because the voltage control for programming the four Vt levels in the present invention is done by bit line voltage control rather than word line voltage control, the programming of the different Vt levels of the MLC of the present invention can be processed in parallel.

Figure 6:
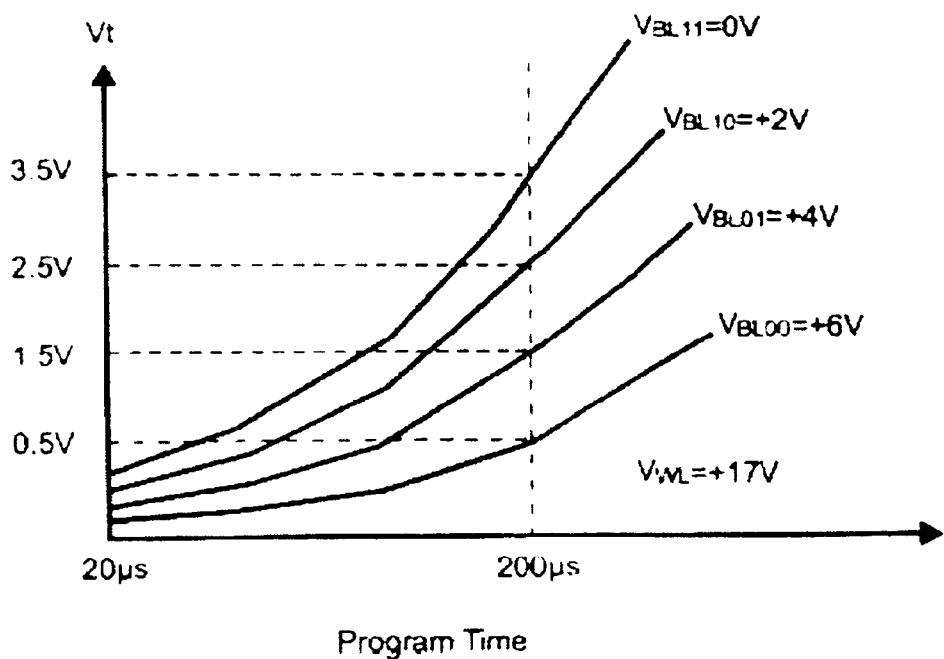
FIG. 6 is a graph showing the program time for various Vt levels of the present invention.

FIG. 6 shows a curve of the Vt of cells vs. programming time for the present invention for the four cells M1, M2, M3 and M4. All four cells will be programmed to the desired Vt in approximately 200 us. The method of the present invention has several advantages. All the cells in one page (word line) can be programmed to different Vt in parallel, significantly increasing the programming throughput. The overall programming time is significantly reduced to $\frac{1}{2}^N$ compared with the prior art, and is comparable to traditional single bit cell. The disturb time is significantly reduced to $\frac{1}{2}^N$ compared with the prior art, and is comparable to traditional single bit cell. The design for the programming pulse and algorithm is simplified since the programming time for all of the different Vt is similar.

The present invention reverses the program condition of the prior art by applying positive high voltage, e.g. +17V, to the word line as compared to a high negative voltage. The positive bias on the word line places the channel of a programmed cell in a turned on condition, eliminating the potential break down condition, the BTBT current and allowing a smaller cell size for improved integration. Because the channel of the programmed cell is turned on, it will pass the bit line voltage to the source line through the channel region making the drain, source and channel the same voltage, and FN tunneling will occur between the channel region and the floating gate. Electrons are injected from the channel region into the floating gate, which is known as 'channel programming'. The present invention uses a novel parallel channel programming approach that combines both the advantages of the parallel programming and channel programming without sacrificing any trade off issues.

Channel programming comprises several advantages. Problems of the prior art, such as drain junction breakdown, BTBT current, channel punch through, hole injection, etc. will not occur. The cell can use shallow, symmetrical drain and source junctions, thus considerably reducing the cell size. The channel length of the cell can be made small. The voltage pump supply current can be significantly reduced to realize low power consumption during programming. The cell can achieve higher endurance cycle since to the hole injection problem is prevented by the present invention.

It should be noted that, although, the word line voltage and bit line voltages are shown in fixed values, the voltages can be altered throughout the program operation. According to the first embodiment of the invention, a conventional smart programming algorithm can be also implemented with association to the MLC parallel programming scheme of the present invention. For example, at the beginning of the program operation, the word line voltage, the bit line voltages and the source line voltages are set as shown in FIG. 5. During the program operation, a program-verify operation is applied periodically to check the Vt of the programmed cells. If a cell is successfully programmed to the desired Vt level, the corresponding bit line voltage will be changed from a programming voltage to a program inhibit voltage to stop the further programming of that cell. In the example shown in FIG. 5, the program inhibit voltage can be +6V to +8V. The program inhibit voltage will pass to the channel of the selected cell, and significantly reduce the floating-gate to channel voltage and stop the further programming of this cell.

According to the second embodiment of the present invention, a soft programming algorithm can be implemented with the MLC parallel programming scheme of the present invention. The soft programming algorithm applies increased (or decreased) voltages to the word line, bit lines, or both word line arid bit lines to prevent the fast cells, which have extremely fast programming speed caused by process variation, from being programmed too fast and causing an over programming problem. FIG. 7A and FIG. 7B show two examples of soft programming algorithms. In the algorithm shown in FIG. 7A, the word line voltage is slightly increased from a lower voltage, e.g. +13V, at the beginning of the program operation to the target voltage, e.g. +16V. In the second soft programming algorithm shown in FIG. 7B, both the word line voltage and bit line voltages are slightly increased from the lower voltages at the beginning of the program operation to the higher target voltages.

The decision to use the soft-programming, or not, is dependant on the manufacturing process control for the cells. If the process control is tight such that the program speed between each cell does not have a large variation (experimental value), then the soft programming can be skipped, and the normal programming using fixed bias voltages is used. If the process control causes large variation in programming speed of the cells, then the additional soft programming in the beginning of the program operation is preferred.

Figure 8:
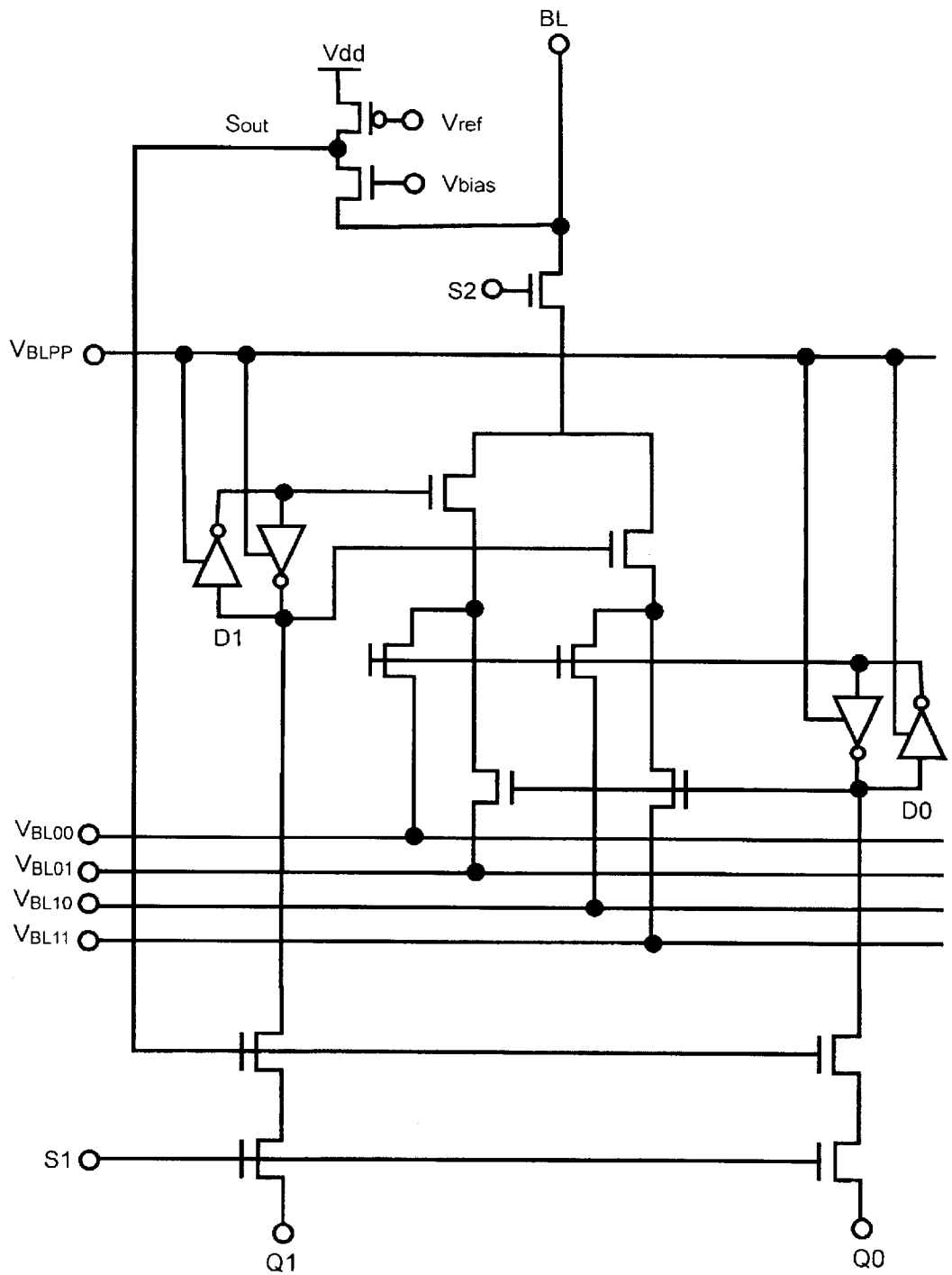
FIG. 8 is a circuit of a bit line data buffer and voltage control to implement the MLC parallel programming scheme of the present invention.

FIG. 8 shows a circuit of a bit line data buffer and bit line voltage control to implement the MLC parallel programming scheme according to the present invention. Each bit line data buffer contains two latches D0 and D1 to store the two bits of data for a cell. To program the selected cell to the desired Vt, the two bits of data for the programmed cell is inputted from data bus Q1 and Q0 and stored in the latches D1 and D0. The stored data in the latches will decode one of the voltages from the common voltage bus lines, VBL00, VBL01, VBL10 and VBL11, and pass the bit line voltage to the selected bit line BL.

Figure 9A:
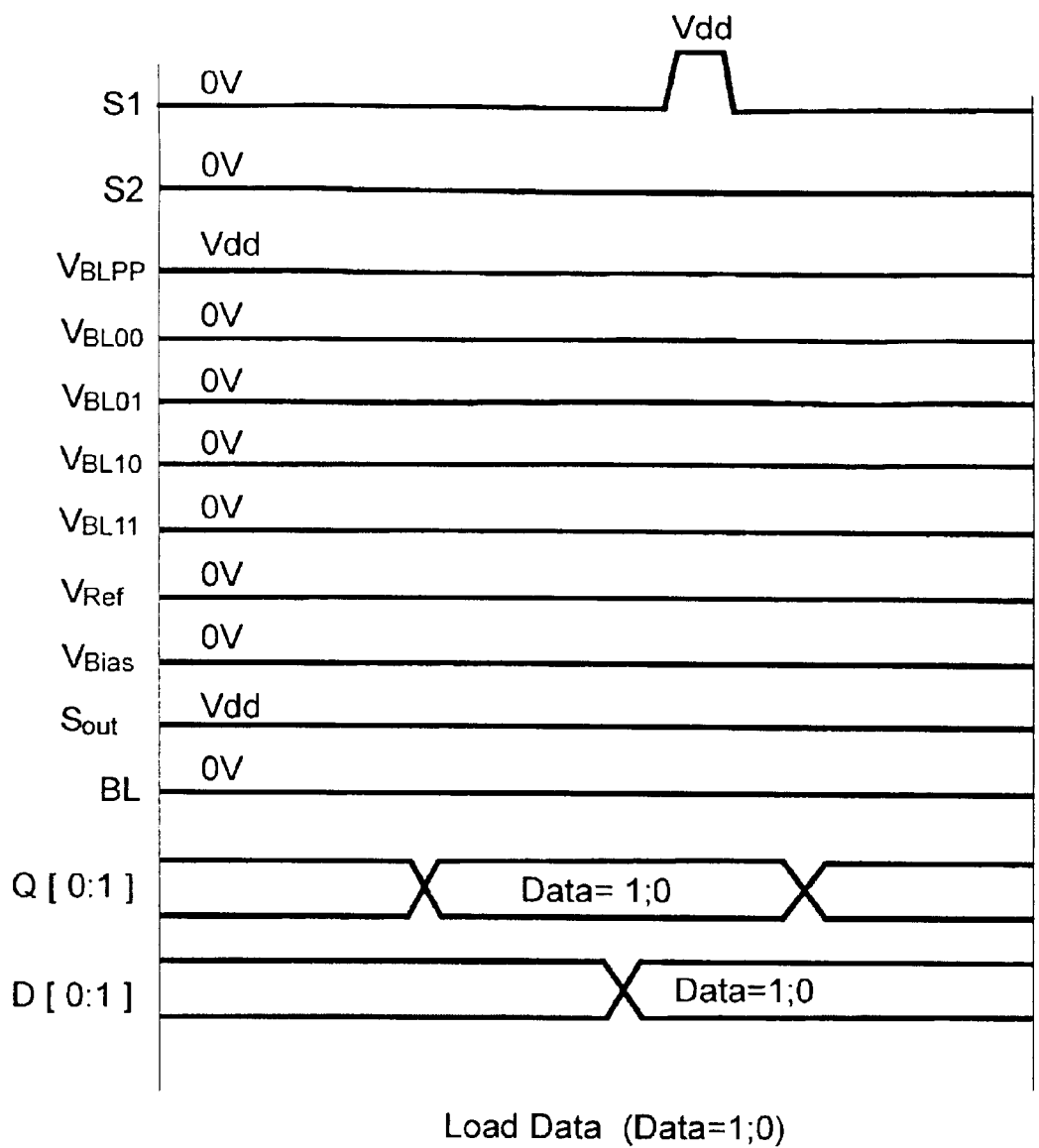
FIG. 9A shows the voltages and waveforms necessary to load data into the data latches of the circuit of FIG. 8.

Referring to FIG. 9A, the select data Q0 and Q1 is loaded into the two data latches D0 and D1. The two latches D0 and D1 are powered to Vdd and switch S1 is selected to connect the select data Q0 and Q1 to the latches D0 and D1. During this time the voltage buss lines VBL00, VBL01, VBL10 and VBL11 are held at 0V and the voltage connected to the bit line BL is also at 0V.

Figure 9B:
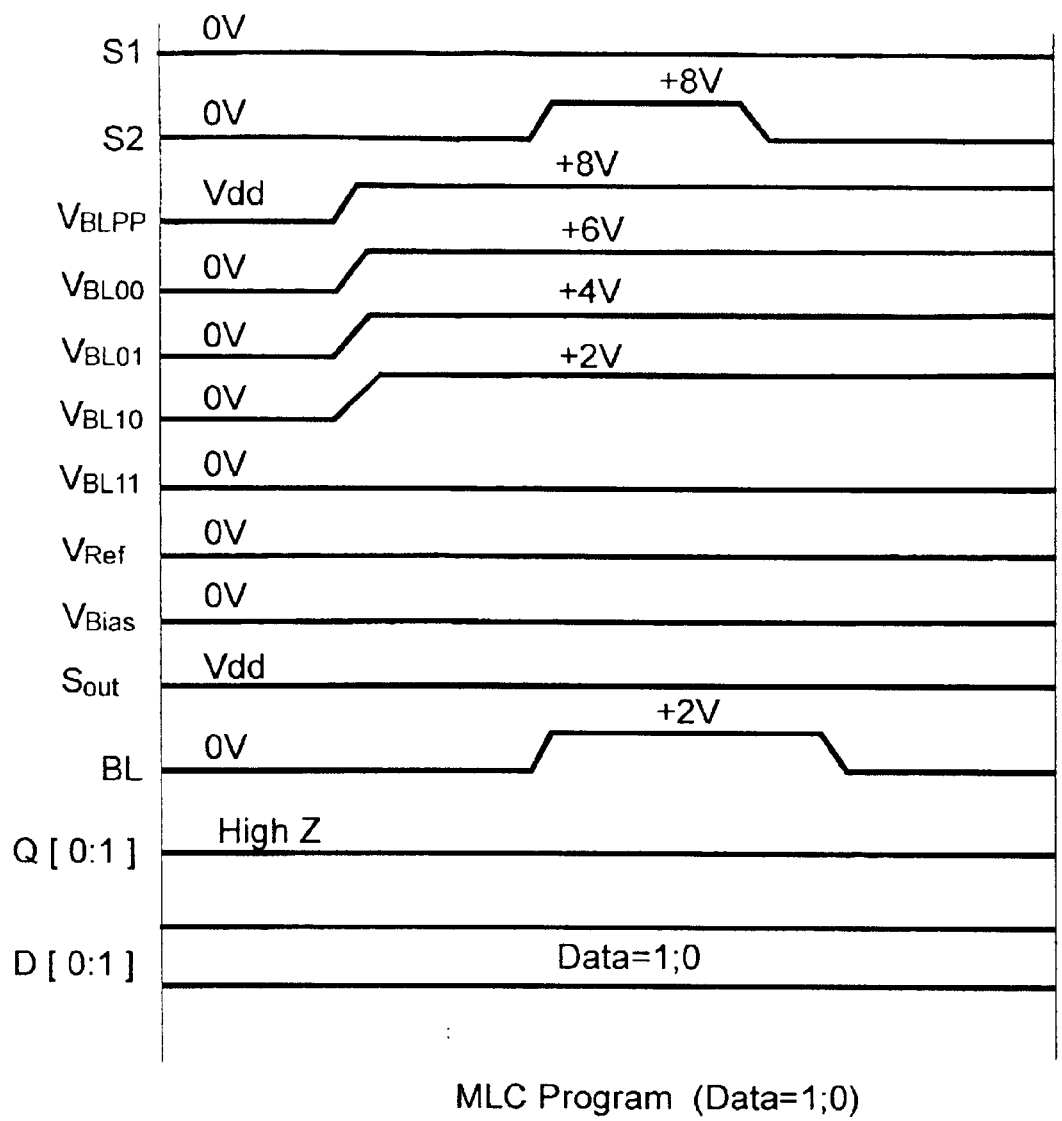
FIG. 9B shows the voltages and waveforms necessary to create a bit line voltage using the circuit of FIG. 8.

Referring to FIG. 9B, a bit line voltage of +2V is created by programming the D0 latch to a logical "1" and the D1 latch to a logical "0". The programming of D0 and D1 selects VBL10 to be connected to the bit line BL when switch S2 is closed.

Figure 9C:
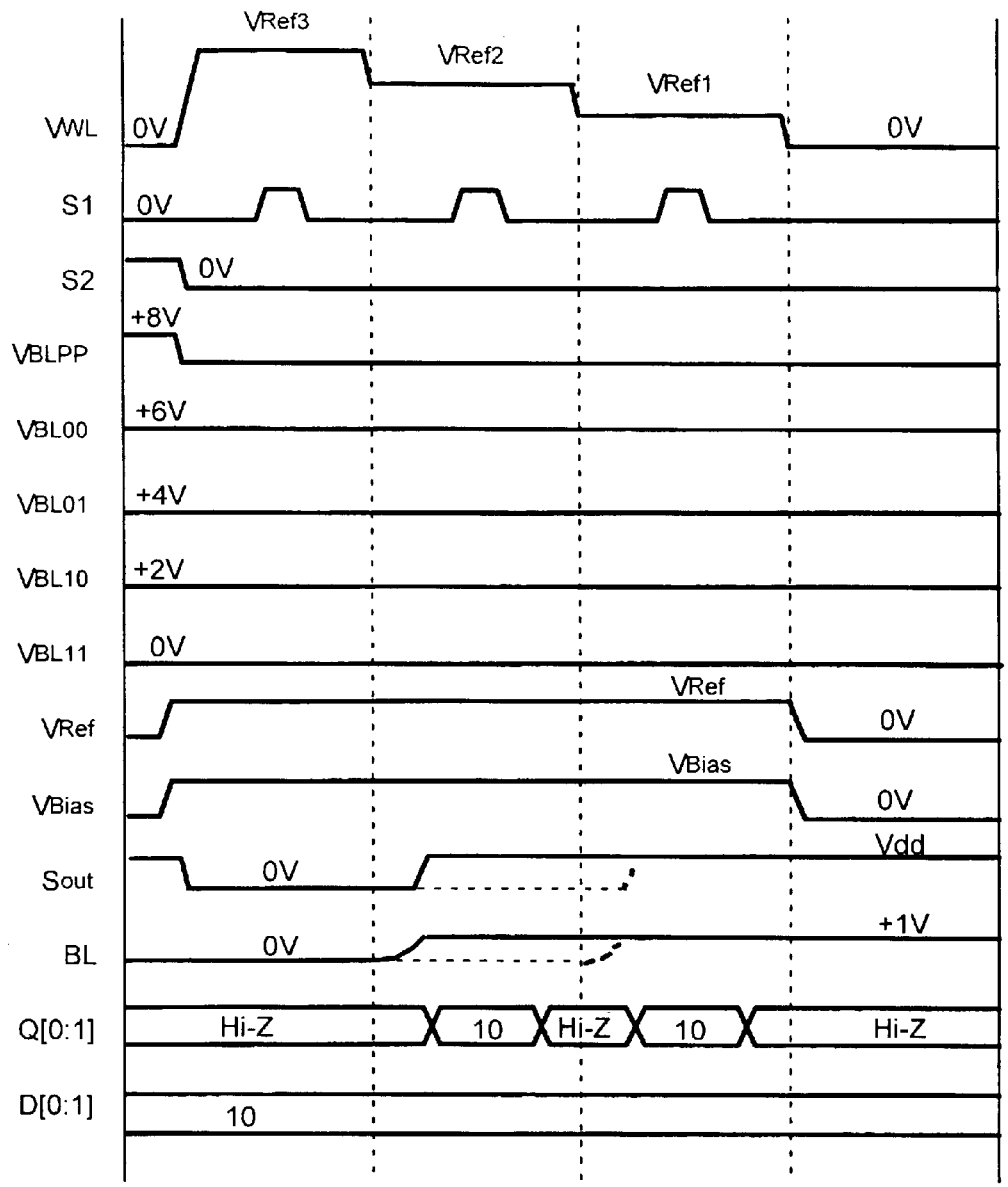
FIG. 9C shows the waveforms necessary to perform program verification using the circuit of FIG. 8.
Figure 9D:
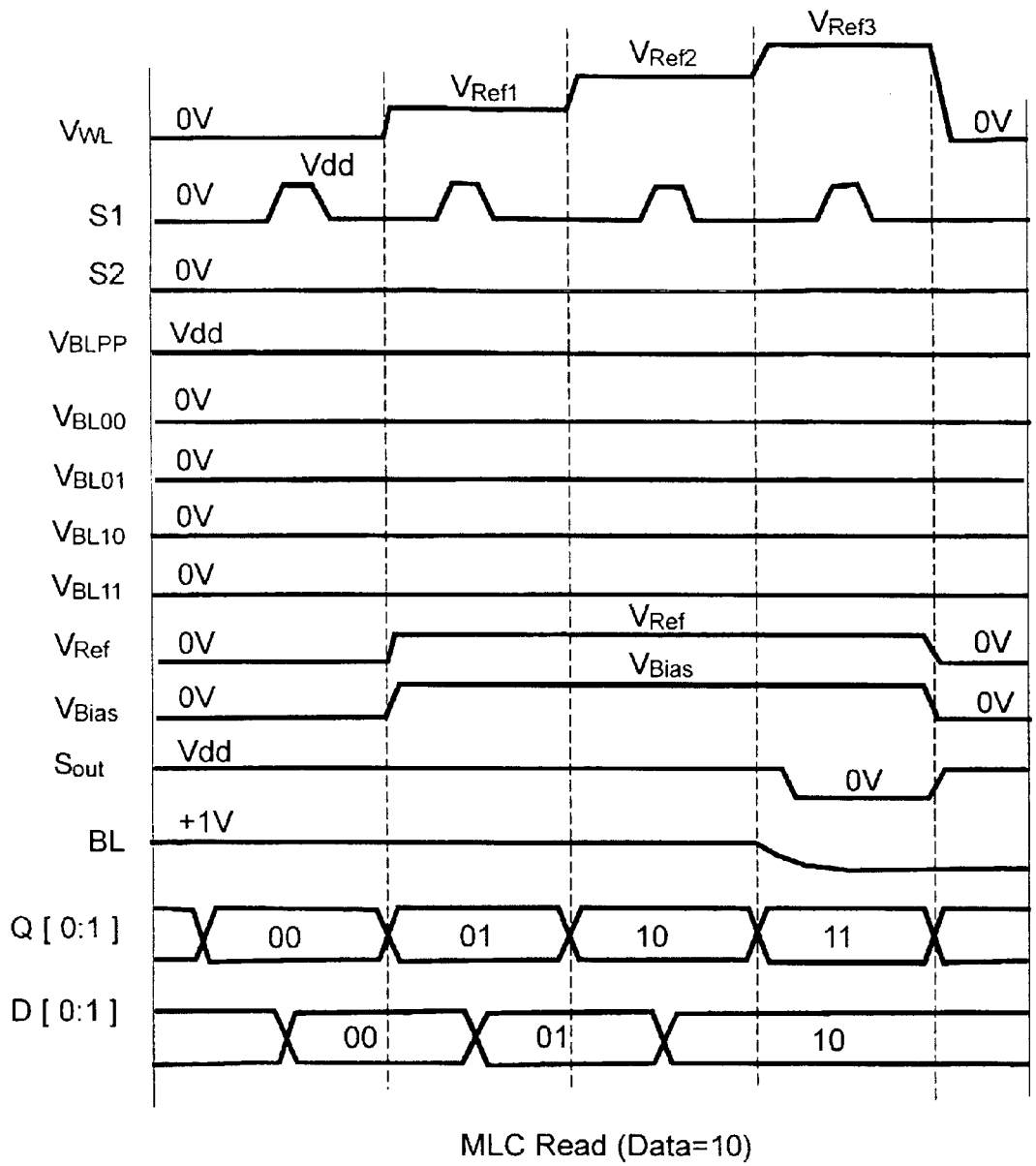
FIG. 9D shows the waveforms necessary to perform a read operation using the circuit of FIG. 8.
Figure 9E:
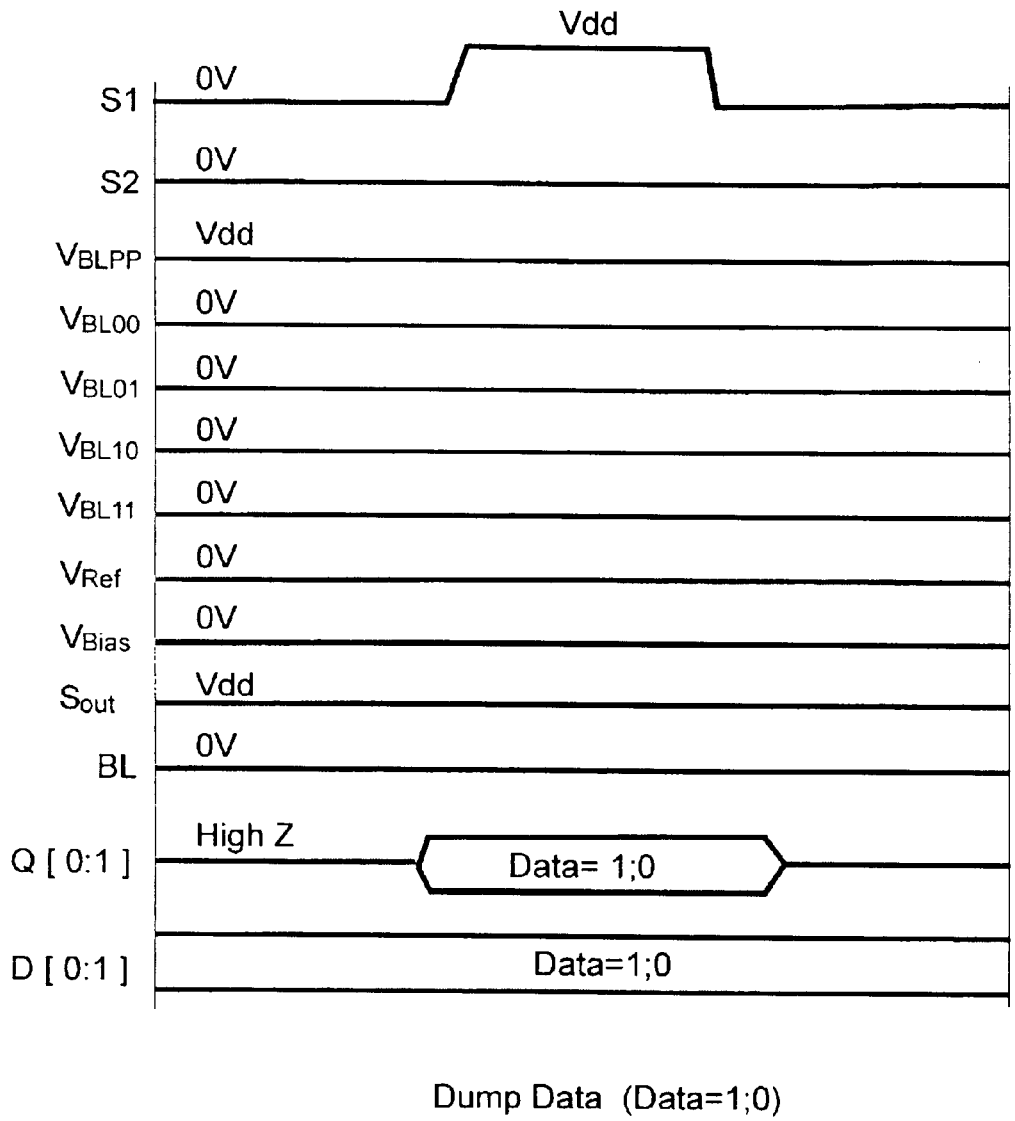
FIG. 9E shows the waveforms necessary to perform a data dump from the registers of the circuit of FIG. 8.

FIGS. 9C to 9E show the waveforms to control the bit line data buffer and bit line voltage control circuit, shown in FIG. 8. FIG. 9C shows the waveform for program-verification. Referring to FIG. 9B, during the MLC parallel programming, the bit line (BL) is applied with one of the four voltages, 0V, +2V, +4V, and +6V, provided by VBL11, VBL10, VBL02, and VBL00, respectively. The voltage is selected by the data stored in the two-bit data latches, D1 and D0. For example, if D1 is logic '0' (voltage level 0V) and D0 is logic '1' (voltage level Vdd), the latches will select VBL01 to be passed to the bit line BL. Therefore, the bit line BL can be applied with a correct bias voltage suitable for the MLC parallel programming, according to the two-bit data. In order to pass the selected voltage from VBL11, VBL10, VBL02, and VBL00 to the bit line BL, the data latches are connected to a high voltage source VBLPP. During program mode, VBLPP is raised up to about +8V to allow the 0V~+6V fully pass the NMOS transistor to the bit line. VBLPP returns to Vdd during other modes so the data latches perform a normal latch function.

After the cell is programmed for a predetermined time, a program-verify operation is performed to check if the cell is successfully programmed. A proper voltage is applied to the word line to check if the cell is programmed to the target threshold voltage (Vt). If the cell is not programmed to the target threshold voltage, the cell will be turned on to conduct current. Then, another program pulse is applied. The program and the program-verification steps are repeated alternatively until all the cells are successfully program and pass the program-verification.

Figure 1:
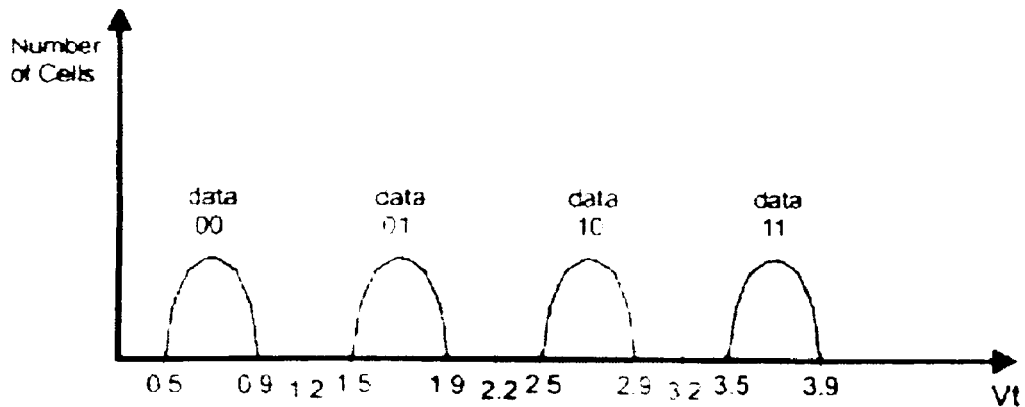
FIG. 1 is a graph showing the Vt distribution for a MLC of prior art.
Figure 2:
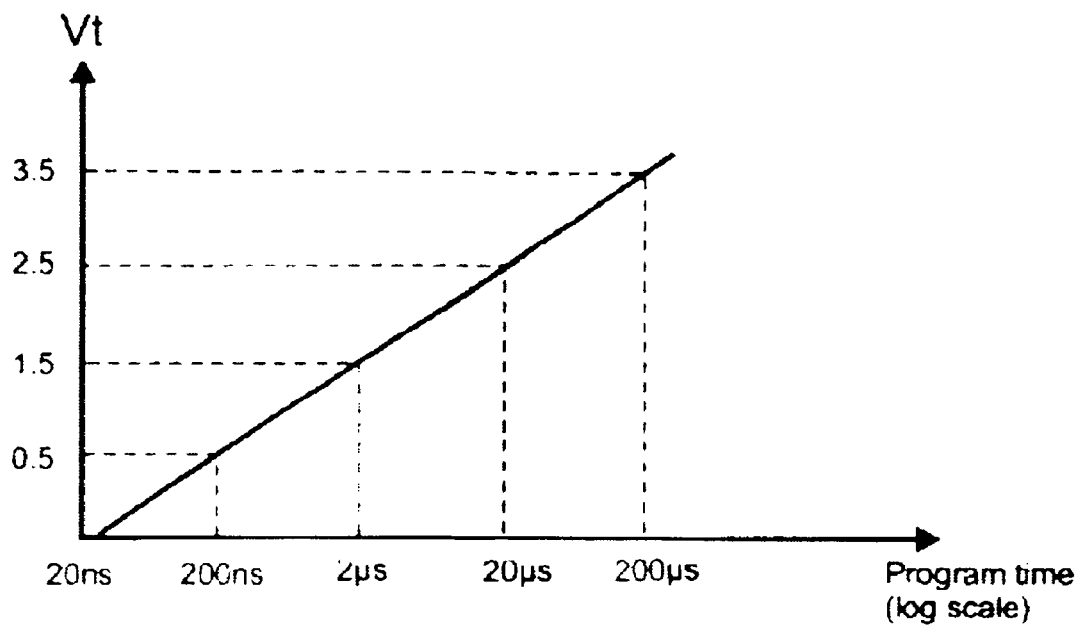
FIG. 2 is a graph showing the programming time for various Vt levels of an MLC of prior art.

FIG. 9C shows the control waveform for the program-verification. During the program-verification, the word line voltage (VWL) is applied to the word line with three voltage steps, VRef3, VRef2, and VRef1, to read the MLC cell. These three voltage levels are set in-between the MLC cells' four Vt distribution levels. Exemplary values of the voltages VRef1, VRef2, VRef3 are shown in FIG. 1, where they are 1.2V, 2.2V, and 3.2V, respectively. Because the word line voltage is ramped down stepwise, the cell will remain with the channel-on until the word line voltage is lower than the Vt of the cell, then the cell will be turned off.

Referring to FIG. 8, the PMOS transistor biased by Vref and NMOS transistor biased by Vbias form a single-ended sense amplifier. During the above-mentioned word line ramping process, the signal S2 goes low (0V) to isolate the bit tine BL from the voltage source voltages, VBL00, VBL01, VBL10, and VBL11. Proper voltages are applied to Vref (e.g. Vdd-Vtp) and Vbias (e.g. 2Vtn) to bias the sense amplifier to detect the bit line leakage current. Where, Vtp is a threshold voltage of the PMOS transistor, ~0.9V, and Vtn is the threshold voltage of the NMOS transistor, ~0.7V. Vref is uses to adjust the pull-up resistance of the PMOS transistor. Vbias is used to clamp the bit line BL voltage not exceeding Vbias-Vtn to prevent the Vt of the cell from being disturbed by the bit line voltage. The voltage Sout is determined by the ratio between the resistance of the PMOS transistor and the cell's leakage current. By properly select the voltages Vref and Vbias, and the sizes of the devices, the output Sout can have a digital-like performance. When the cell is turned on and its leakage current is larger than a predetermined value, the voltage level of Sout will be pull down to near ground; otherwise, the Sout is pulled up to Vdd by the PMOS transistor biased by Vref. Therefore, during the above-mentioned word line ramping-down process, the cell is originally turned on, and Sout remains at a low voltage until the word line voltage is lower than the Vt of the cell, then the cell is turned off, which makes Sout go high. The signal S1 is turned on for a short pulse during each word line level to sample the output of the sense amplifier, Sout. If Sout is high, data stored in data latches D1 and D0 will be past to the data bus Q1 and Q0. The state machine will compare the latched data with the data corresponding to the current word line voltage. The corresponded data are 00, 01, 10, and 11 while the word line voltage is 0V, VRef1, VRef2, and VRef3, respectively. If there is a match (the same data), the Vt of the cell is successfully programmed to desired level. The data latches are reset to data 00 by Q1 and Q0. Therefore, when the next program pulse is applied, the data latch will select +6V to be applied to the bit line to inhibit the cell from being further programmed. For example, assuming the data latches D1 and D0 store data 10. If the cell is successfully programmed to Vt higher than VRef2, when the word line is applied with VRef2, the cell is turned off which makes Sout high to pass the data latches data 10 to the data bus Q1 and Q0. The state machine then will reset the data latch D1 and D0 to 00 through the data bus Q1 and Q0. If the latched data is not equal to the data corresponding to the present word line voltage, the latched data will be kept unchanged. For example, if the Vt of the cell is still lower than VRef2, between Vref2 and Vrefl, the cell will not be turned off until the word line is applied with VRef1 (as shown in dashed line in FIG. 9C for Sout and BL). Since the data corresponding to VRef1 is "01", rather than "10", the data "10" stored in the data latch D1 and D0 will be kept. Thus, when the next program pulse is applied, the data latch will select the correct bit line BL voltage to repeat the parallel MLC programming. The program and program-verification process will be repeated until all the cells are successfully programmed. The state machine will detect that all the data latches are reset to 00 and stop the program operation.

FIG. 9D shows the waveform of the MLC read operation. During the read operation, the word line is applied with the four stepwise voltage levels, similar to program verification, but applied ramping-up instead of ramping-down. The data lines Q1 and Q0 are applied with the two-bit digital data corresponding to the preset word line voltage level. For example, the Q1, Q0 are set as 00, 01, 10, and 11 while the word line voltage is 0V, VRef1, VRef2, and VRef3, respectively. The signal S1 is turned on for a short pulse during each word line level to sample the output pf the sense amplifier, Sout. If Sout is high, it will allow the data of Q1 and Q0 be loaded into the data latches D1 and D0. Since the WL is ramped up stepwise, the cell will remain at an off condition until the correct WL voltage is reached, then it becomes a channel-on state. Therefore, the Sout will be always high (Vdd) until the correct WL voltage is reached, then Sout will go low (0V). For example, assuming the cell data is "10", the Vt level of the cell is between VRef2 and VRef3. When the word line is applied with 0V, VRef1, and VRef2 stepwise, Sout is always high, and allows the data bus Q1 and Q0 to load the corresponding data, 00, 01, and 10, to the data latches D1 and D0, respectively. When the word line is ramped up to VRef3, the cell becomes an on-cell and pulls down the Sout to 0V, then the data bus Q1 and Q0 are blocked from loading the data "11" into the data latches. The data latches D1 and D0 then stores the correct data "10". This MLC read sequence can be applied to the whole page (multiple bytes) simultaneously to save sensing time. After the data of a whole page is stored in the data latches, the data latches of each byte can be accessed in a random or serial sequence, depending on the product application.

Referring to FIG. 9E, the data in the two data latches D0 and D1, shown in FIG. 8, is coupled (data dump) to data buses Q0 and Q1 to be sent to output circuitry to be read. A read is performed in FIG. 9D where new data is stored into the data latches D0 and D1. The data dump of FIG. 9E is performed after a data read. This is a unique operation for an MLC read and the data can be held in the data latches until a whole page of data, as an example, is stored in the data latches. Then the data latches of each byte can be accessed by a random or serial sequence. The two latches D0 and D1 are powered to Vdd, switch S1 is selected with a positive pulse and Vref and Vbias are grounded to make Sout high with S2 grounded to isolate the bit line BL from the voltage path. Then the data is connected D0 and D1 is connected to the buses Q0 and Q1. During this time the voltage buss lines VBL00, VBL01, VBL10 and VBL11 are held at 0V and the voltage connected to the bit line BL is also at 0V.

Figure 10A:
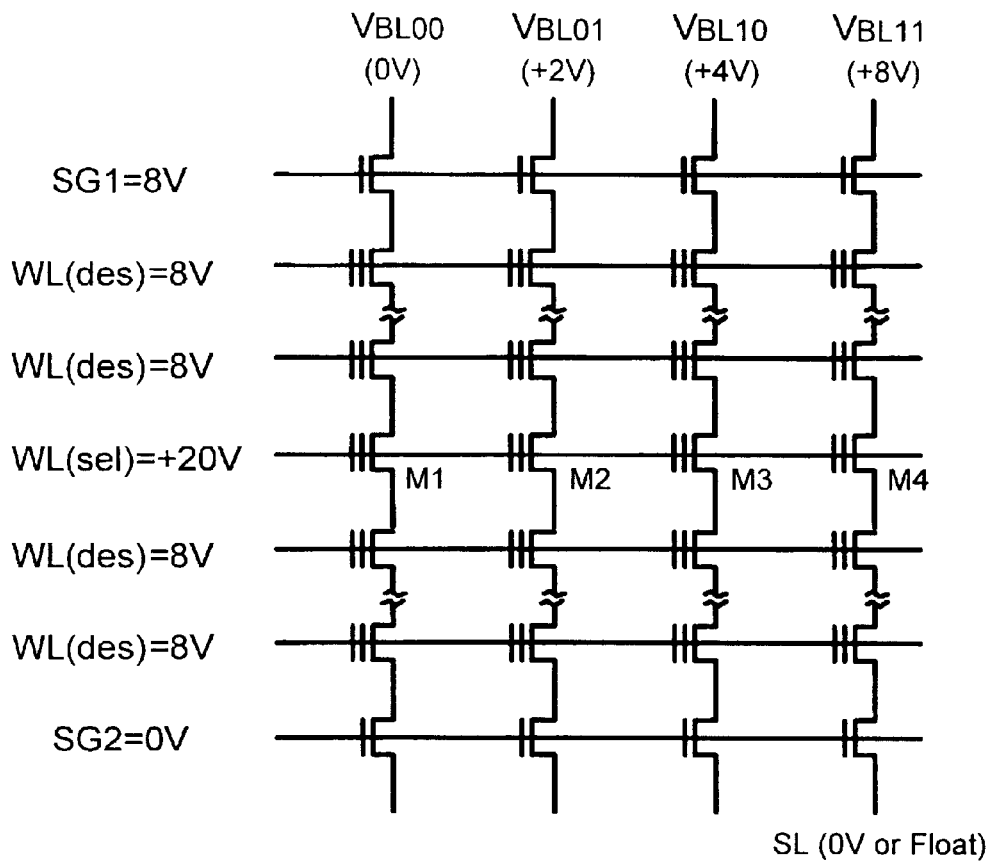
FIG. 10A is a circuit diagram of a NAND-array using the parallel MLC programming of the present invention.

The parallel MLC programming scheme of the present invention can be implemented not only on a NOR-type array, but it can be implemented on all the different types of applicable arrays. For example, the parallel MLC programming scheme can be implemented on a NAND-type array. Referring to FIG. 10A, an exemplary NAND-array is shown using the parallel MLC programming of the present invention. Four different voltage levels, VBL00, VBL01, VBL10, and VBL11 are applied to the four bit lines that are shown. The selected word line WL(sel) is coupled to a positive high voltage (e.g. +20V). The deselected word lines WL(des) and the bit line select transistor SG1 are coupled to a lower voltage (e.g. +8V) to pass the four bit line voltages to the selected cells, M1, M2, M3, and M4. The NAND cells are erased before programming to a low Vt, or more preferably to a negative Vt (e.g. −2V). This is because the cells of the NAND-array cells are serially connected; and it allows the Vt of the on-cells being negative to conduct more read current. Unlike the NAND-array, NOR-array can not allow negative Vt cells because the leakage current will cause malfunction in the parallel-connected array structure.

Continuing to refer to FIG. 10A, after erasing, the selected cells M1, M2, M3, and M4 are programmed to different Vt levels by applying in high voltage (e.g. +20V) to the word line connected to the cells, and four different voltage levels connected to the bit lines of the NAND array, VBL00, VBL01, VBL10, and VBL11 (e.g. 0V, +2V, +4V, +8V, respectively). The four bit line voltages are passed to the entire channel region of the four selected cells by the high gate voltage, so the channel-programming mechanism starts to happen. Due to the different voltage between the gates and the channel of the four cells, the Vt of the cells increases at four different speeds. The gate to channel voltage difference for cell M1 is 20V, which is the largest voltage difference, so cell M1 has the fastest programming speed. The gate to channel voltage difference for cell M2 is 18V, which is second largest difference, so cell M2 has the second fastest programming speed. Similarly, the M3 and M4 cell gate-to-channel voltage difference are 16V and 12V, respectively, so the programming speeds are such that M1>M2>M3>M4. This characteristic allows the four cells be programmed to four different threshold voltages within the same programming time, which allows the parallel MLC programming result to be realized. The source line select transistor, SG2, is turned off to cut off the bit line DC current; therefore, the programming scheme requires very low current on both word lines and bit lines. The voltage level of the deselected word lines is optimized to be high enough to fully pass the four bit line voltages, while it is low enough to have sufficient margin for preventing the disturb problem from happening to the deselected word lines. It is also worthy to notice that the voltage levels of the deselected word lines between the selected cell and the source line SG2 can be coupled to a lower voltage level, or even 0V, because these word lines need not to pass the bit line voltages.

Figure 10B:
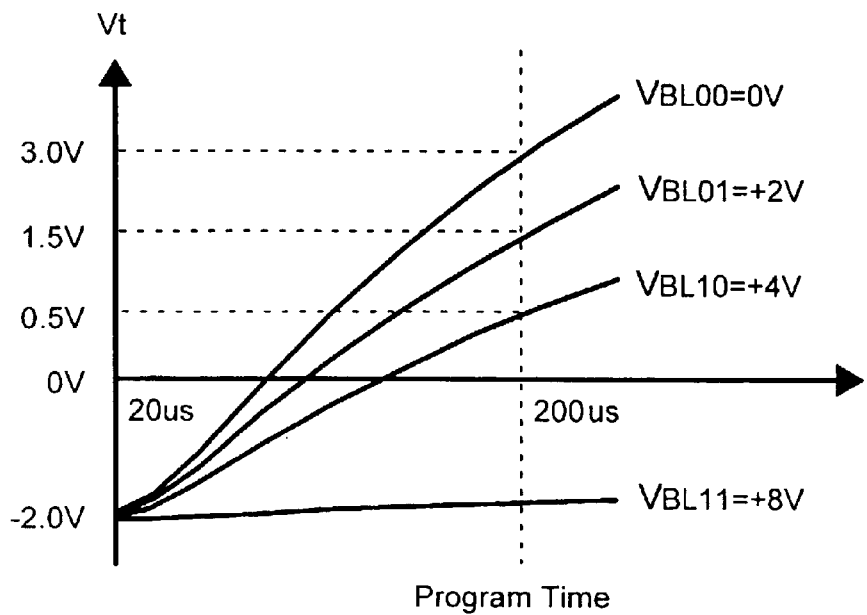
FIG. 10B shows an exemplary curve for parallel MLC programming of a NAND-array of the present invention.

FIG. 10B shows a graph of an exemplary curve for the parallel MLC programming scheme for a NAND-array, where, all the four cells are started to be programmed from Vt=−2.0V. By applying the same WL voltage (e.g. +10V) but different bit line voltages, VBL00, VBL01, VBL10, VBL11 (e.g. 0V, +2V, +4V, +8V respectively), the Vt of the four cells is programmed to four different levels, 3.0V, 1.5V, 0.5V, and −1.88V, respectively, in the same programming time 200 us. As a result, the high-speed, high efficiency parallel programming for MLC is realized.

The bit line voltage VBL11 (i.e. +8V) is intended to use the higher voltage to keep the Vt of cellM4 in a negative Vt region to conduct higher read current when the cell is selected. It should be noted that the Vt distribution and the applied bias voltage levels discussed herein are for example and are not meant to imply the only combination of voltage levels to make the present invention operate. One may vary these values to adjust the required Vt distribution and fulfill different program time requirement. The four level cell is also an example. It should be noted that any number of MLC programming levels, such as eight levels or sixteen levels, can be also implemented by using a similar approach as discussed for the four level parallel MLC programming.

It should also be noted that, the disclosed parallel MLC programming scheme can be applied not only in the direction of increasing the Vt of the programmed cells, but it can be also applied to decrease the Vt of the programmed cells. For example, by applying the four different bit line voltages, VBL00, VBL01, VBL10, and VBL11, when changing the selected word line voltage from positive voltage (i.e. +20V) to negative voltage (e.g. −10V), the Vt of the four selected cells will be decreased instead of increased. Since the voltage between the bit line of the cells and the word line are different, 10V, 12V, 14V, 18V, for cell M1, M2, M3, and M4, respectively, the Vt of the cells are decreased at four different speeds. The decreasing speeds for the four cells will be in the order of M4>M3>M2>M1 since M4 has the highest voltage difference and M1 has the lowest difference. This results in parallel programming (decreasing the Vt of the cell) for the selected cells. However, the Vt distribution is reversed, and the Vt of the cells has to be 'erased' to high Vt (e.g. +3V). Then the parallel programmed to four low Vt (e.g. 3.0V, 1.5V, 0.5V, −2.0V). Compared with the first embodiment that increases the Vt of the cells during programming, this third embodiment, where the Vt of the cells is decreasing during programming, might result in higher programming speed because it uses 'edge' programming. The channel of the selected cells is turned off by the negative word line voyage, so the bit line voltages are applied to the drain side of the cells only, not the entire channel region as the first embodiment. It is well known that this may cause faster programming due to a less voltage coupling effect from the channel to the floating gate, but may reduce the cell's endurance cycles because of the drain-side hot-hole injection.

While the invention has been particularly shown and described with reference to preferred embodiments thereof, it will be understood by those skilled in the art that various changes in form and details may be made without departing from the spirit and scope of the invention.

What is claimed is:

1. A method of parallel programming flash multiple level cell (MLC) memory comprising
   a) coupling a plurality of voltages simultaneously to both the bit line and the source line of a plurality of memory cells for a predetermined amount of time,
   b) coupling a high word line voltage to a word line connecting to said plurality of memory cells for said predetermined amount of time,
   c) programming said plurality of memory cells to a plurality of threshold voltages wherein said threshold voltage of said memory cell coupled to a larger bit line voltage is smaller than said threshold voltage of said memory cell coupled to a smaller bit line voltage,
   d) verifying the programming of said N memory cells.

2. The method of claim 1, wherein said source line is floating.

3. The method of claim 1, wherein each of said plurality of voltages coupled to said plurality of bit lines of the plurality of memory cells are chosen to produce the plurality of threshold voltages in which said the plurality of threshold voltages are attained during a single program duration at a fixed word line voltage.

4. A method of parallel programming four flash memory multiple level cells (MLC) comprising:
   a) coupling a first voltage to both a bit line and a source line of a first memory cell,
   b) coupling a second voltage larger than said first voltage to both the bit line and the source line of a second memory cell,
   c) coupling a third voltage larger than said second voltage to both the bit line and the source line of a third memory cell,
   d) coupling a fourth voltage larger than said third voltage to both the bit line and the source line of a fourth memory cell,
   e) coupling a word line voltage of high value to a word line coupled to control gates of said first, second, third and fourth memory cells,
   f) programming said first memory cell to a first threshold voltage level, said second memory cell to a second threshold voltage level which is smaller than said first threshold voltage level, said third memory cell to a third threshold voltage level which is smaller than said second threshold voltage level, and said fourth memory cell to a fourth threshold voltage level which is smaller than said third threshold voltage level,
   g) verifying said first memory cell is programmed to said first threshold voltage level, said second memory cell is programmed to said second threshold voltage level, said third memory cell is programmed to said third threshold voltage level, and said forth memory cell is programmed to said fourth threshold voltage level.

5. The method of claim 4, further comprising:
   a) coupling a plurality of voltages to both the bit line and the source line of a plurality of memory cells,
   b) coupling a high word line voltage to a word line connecting to said N memory cells,
   c) programming said plurality of memory cells to a plurality of threshold voltages wherein said threshold voltage of said memory cell coupled to a larger bit line voltage is smaller than said threshold voltage of said memory cell coupled to a smaller bit line voltage,
   d) verifying the programming of said plurality of memory cells.

6. The method of claim 5, wherein programming the plurality of memory cells to the plurality of threshold voltages of predetermined values is accomplished simultaneously by coupling said plurality of voltages of a plurality of predetermined values to bit lines and source lines of said plurality of memory cells during said predetermined amount of time when said word line voltage is coupled to said word line.

7. The method of claim 4, wherein verifying the programming of said memory cells is done by checking the voltage threshold level of the cells, and changing a corresponding bit line voltage to a program inhibit voltage level when the cells have been detected to be programmed.

8. The method of claim 4, wherein said first and second source lines are floating.

9. The method of claim 4, wherein said word line voltage coupled to said word line varies from a low initial value to a high final value during parallel programming of said memory cells.

10. The method of claim 9, wherein said first voltage varies from a first low value to a first high value and said second voltage varies from a second low value to a second high value during parallel programming of said memory cells.

11. The method of claim 5, wherein programming the plurality of memory cells to the plurality of threshold voltage levels having predetermined values is accomplished simultaneously by coupling the plurality of voltages of a plurality of predetermined values to bit lines and source lines of said N memory cells during said predetermined amount of time when said word line voltage is coupled to said word line.

12. The method of claim 11, wherein said source lines are floating.

13. The method of claim 11, wherein said word line voltage coupled to said word line varies from a low initial value to a high final value during parallel programming of said memory cells.

14. The method of claim 13, wherein said plurality of voltages vary from an initial low value to a final high value during parallel programming of said memory cells.

15. The method of claim 4, wherein programming a plurality of memory cells to a same threshold voltage level is accomplished simultaneously by coupling the plurality of voltages of a same value to bit lines and source lines of said plurality of memory cells during said predetermined amount of time when said word line voltage is coupled to said word line.

16. The method of claim 15, wherein said source lines are floating.

17. The method of claim 15, wherein said word line voltage coupled to said word line varies from a low initial value to a high final value during parallel programming of said memory cells.

18. The method of claim 17, wherein said plurality of voltages vary from a same low value to a same high value during parallel programming of said memory cells.

19. A parallel programming means for a multiple level cell (MLC) flash memory array, comprising:
   a) a means for coupling a first positive voltage to a first bit line connected to a first MLC flash memory cell to be programmed,
   b) a means for coupling a second positive voltage to a second bit line connected to a second MLC flash memory cell to be programmed,
   c) a means for coupling a third positive voltage of high value to a word line connected to said first and second MLC flash memory cells,
   d) a means for activating said first, second and third positive voltages simultaneously for a predetermined amount of time to program in parallel said first and second MLC flash memory cells,
   e) a means for verifying a threshold voltage level of said first and second flash MLC memory cells, and for inhibiting from further programming cells that have reach a predetermined threshold voltage level.

20. The parallel programming means of claim 19, wherein said first and second positive voltages and said third positive voltage combine to produce a channel voltage in said first and second MLC flash memory cell that is of a value necessary to program simultaneously said predetermined threshold voltage level for each said memory cell within a predetermined amount of time.

21. The parallel programming means of claim 19, further comprising means for coupling a plurality of positive voltages to a plurality of bit lines connected to a plurality of memory cells that are connected to said word line and to program in parallel said plurality of memory cells by simultaneously activating said plurality of positive voltages and said third positive voltage.

22. The parallel programming means of claim 21, wherein said third positive voltage varies from a low initial value to a high final value.

23. The parallel programming means of claim 22, wherein said plurality of positive voltages vary from a plurality of low initial values to a plurality of high initial values.

24. The parallel programming means of claim 22, wherein said plurality of positive voltages comprise a number of positive voltages that are a same value.

25. A means for programming an MLC memory array, comprising:
   a) a means for coupling bit line voltages to cells to be programmed,
   b) a means for coupling a word line voltage of high positive value to said cells to be programmed,
   c) a means for programming said cells in parallel by activating simultaneously for a predetermined amount of time a plurality of said bit line voltages and said word line voltage,
   d) a means for verifying a threshold voltage level of said cells during programming and inhibiting said cells from programming.

26. The means of claim 25, wherein said bit line voltages comprise a plurality of positive voltages of different values.

27. The means of claim 25, wherein said word line voltage varies from a low initial value to a high final value during programming of said cells.

28. The means of claim 27, wherein said bit line voltages start at a value lower than a final value during programming of said cells.

29. The means of claim 25, wherein bit line voltages combined with said word line voltage produce a channel voltage that determines the threshold voltage level of the cells being programmed.

30. The means of claim 25, wherein cells being programmed are inhibited from further programming when said threshold voltage level is at a predetermined value.

31. The means of claim 25, wherein said bit line voltages and said word line voltage combine to produce a channel voltage in said cells that is of a value necessary to program simultaneously a predetermined threshold voltage level for each cell within a predetermined amount of time.

32. A system for parallel programming a flash multiple level cell (MLC) memory, comprising:
   a) a word line selected and coupled to a high positive voltage for a predetermined amount of time,
   b) a plurality of positive voltages,
   c) a first bit line data buffer connecting a first positive voltage of said plurality of positive voltages to a first bit line for said predetermined amount of time,
   d) a second bit line data buffer connecting a second positive voltage of said plurality of positive voltages to a second bit line for said predetermined amount of time,
   e) a first cell selected by said word line and said first bit line programmed to a first threshold voltage level,
   f) a second cell selected by said word line and said second bit line programmed to a second threshold voltage level.

33. The system of claim 32, wherein said first bit line voltage and said word line high positive voltage creates a first channel voltage necessary to program a first cell to a first threshold voltage level, and said second bit line voltage and said word line high positive voltage creates a second channel voltage necessary to program a second cell to a second threshold voltage level simultaneously during said predetermined amount of time.

34. The system of claim 32, further comprising a plurality of bit line data buffers that connect said plurality of positive voltages to a plurality of bit lines for said predetermined amount of time to program a plurality of memory cells to a plurality of threshold voltage levels simultaneously when selected by said word line and said plurality of bit lines.

35. The system of claim 34, wherein said plurality of positive voltages connected to said plurality of bit lines combine with the word line high positive voltage to create a plurality of channel voltages to program said plurality of memory cells to said plurality of threshold voltage levels simultaneously during said predetermined amount of time.

36. The system of claim 34, wherein said plurality of positive voltages are a mixture of voltages having a same value and a different value.

* * * * *